(12) United States Patent
Iuchi et al.

(10) Patent No.: US 11,052,637 B2
(45) Date of Patent: Jul. 6, 2021

(54) STRUCTURE CONTAINING SN LAYER OR SN ALLOY LAYER

(71) Applicant: ISHIHARA CHEMICAL CO., LTD., Kobe (JP)

(72) Inventors: Shoya Iuchi, Kobe (JP); Masaru Hatabe, Kobe (JP); Takahiro Tanaka, Kobe (JP); Fuka Yamaoka, Kobe (JP)

(73) Assignee: ISHIHARA CHEMICAL CO., LTD., Kobe (JP)

( * ) Notice: Subject to any disclaimer, the term of this patent is extended or adjusted under 35 U.S.C. 154(b) by 0 days.

(21) Appl. No.: 16/769,545

(22) PCT Filed: Nov. 27, 2018

(86) PCT No.: PCT/JP2018/043613
§ 371 (c)(1),
(2) Date: Jun. 3, 2020

(87) PCT Pub. No.: WO2019/111767
PCT Pub. Date: Jun. 13, 2019

(65) Prior Publication Data
US 2020/0376808 A1     Dec. 3, 2020

(30) Foreign Application Priority Data

Dec. 4, 2017  (JP) .............................. JP2017-232888

(51) Int. Cl.
*B32B 15/01*  (2006.01)
*B32B 15/04*  (2006.01)
(Continued)

(52) U.S. Cl.
CPC ............ *B32B 15/043* (2013.01); *B32B 15/18* (2013.01); *C25D 3/12* (2013.01); *C25D 3/30* (2013.01);
(Continued)

(58) Field of Classification Search
None
See application file for complete search history.

(56) References Cited

U.S. PATENT DOCUMENTS 6,224,690 B1 *  5/2001  Andricacos ............ B32B 15/01
                                              148/400
9,082,762 B2    7/2015  Kang
(Continued)

FOREIGN PATENT DOCUMENTS

JP    2008-28112 A    2/2008
JP    2015-46268 A    3/2015
(Continued)

OTHER PUBLICATIONS

Koo, J-K, et al. Effects of Complexing Reagent on Electroless Nickel Iron Alloy Plating for the Diffusion Barrier of UBM, Materials Transactions, vol. 58, No. 2, pp. 148-151, 2017.
(Continued)

*Primary Examiner* — Seth Dumbris
(74) *Attorney, Agent, or Firm* — Knobbe, Martens, Olson & Bear LLP

(57) ABSTRACT

A structure containing a Sn layer or a Sn alloy layer includes a substrate, a Sn layer or Sn alloy layer formed above the substrate, and an under barrier metal formed between the substrate and the Sn layer or Sn alloy layer in the form of a single metal layer containing any one of Fe, Co, Ru and Pd, or an alloy layer containing two or more of Fe, Co, Ru and Pd.

1 Claim, 1 Drawing Sheet

(51) Int. Cl.
   *B32B 15/18*   (2006.01)
   *C25D 3/12*    (2006.01)
   *C25D 3/30*    (2006.01)
   *C25D 5/14*    (2006.01)
   *H01L 23/532*  (2006.01)

(52) U.S. Cl.
   CPC .......... *C25D 5/14* (2013.01); *H01L 23/53209* (2013.01); *B32B 2311/09* (2013.01); *B32B 2311/16* (2013.01); *B32B 2311/22* (2013.01); *Y10T 428/12722* (2015.01)

(56) References Cited

U.S. PATENT DOCUMENTS

| | | | |
|---|---|---|---|
| 9,421,644 B2* | 8/2016 | Chen | C23C 28/023 |
| 2008/0029891 A1* | 2/2008 | Joo | H01L 23/53238 |
| | | | 257/751 |
| 2010/0190390 A1* | 7/2010 | Yoshida | H01R 13/03 |
| | | | 439/886 |

FOREIGN PATENT DOCUMENTS

| | | |
|---|---|---|
| KR | 10-0207888 B | 7/1990 |
| WO | WO 2019/111767 A1 | 6/2019 |

OTHER PUBLICATIONS

International Search Report & Written Opinion, dated Jan. 8, 2019, in International Application No. PCT/JP2018/043613.
Notification of Reason for Refusal, dated Jul. 24, 2020, in Korean Application No. 10-2020-7017573.
International Preliminary Report on Patentability, dated Jun. 9, 2020, in International Application No. PCT/JP2018/043613.
Written Opinion, dated Jan. 8, 2019, in International Application No. PCT/JP2018/043613.

* cited by examiner

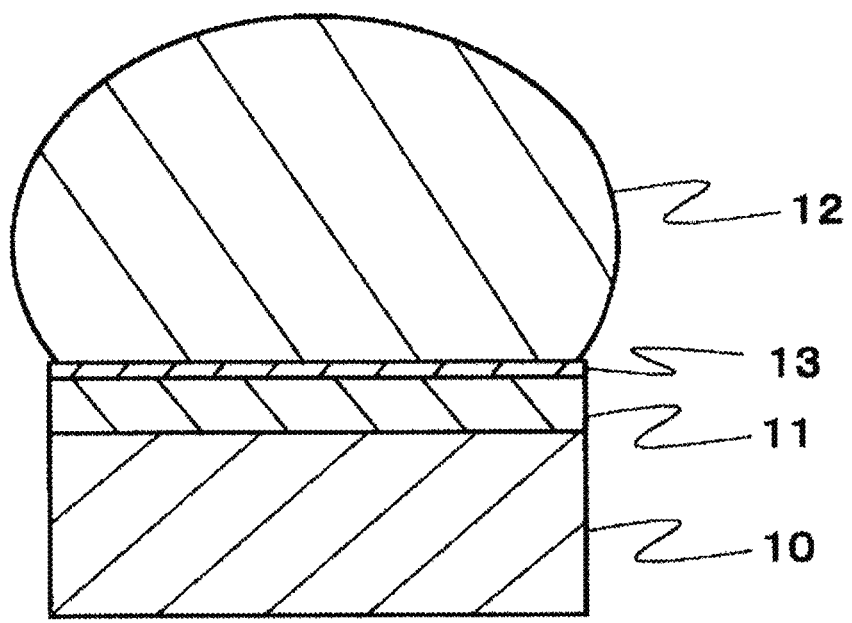

STRUCTURE CONTAINING SN LAYER OR SN ALLOY LAYER

PRIORITY AND CROSS REFERENCE TO RELATED APPLICATIONS

This application is the U.S. National Stage Application under 35 U.S.C. § 371 of International Application No. PCT/JP2018/043613, filed Nov. 27, 2018, designating the U.S. and published as WO 2019/111767 A1 on Jun. 13, 2019, which claims the benefit of Japanese Application No. JP 2017-232888, filed Dec. 4, 2017. Any and all applications for which a foreign or a domestic priority is claimed is/are identified in the Application Data Sheet filed herewith and is/are hereby incorporated by reference in their entirety under 37 C.F.R. § 1.57.

TECHNICAL FIELD

The present invention relates to a structure including a Sn layer or a Sn alloy layer, and more particularly, it relates to a structure including a Sn layer or a Sn alloy layer provided as a conductive component or a connection component of an electrode, a wiring or the like of an electronic component or the like.

BACKGROUND ART

Sn and Sn alloy have a low melting point and excellent ductility, and hence have been conventionally used as a bonding material in an electronic component or the like. In this case, Sn or Sn alloy is provided on a substrate mainly by a ball mounting method, a pasting method, a plating method, an inkjet method or the like. As the substrate, a Cu or Cu alloy-based substrate, a Ni alloy-based substrate or the like is used, or when another non-metal substrate is used, a Cu layer or a Ni layer is generally formed on the substrate by plating, sputtering or the like. In a well-known structure for, for example, a flip chip bump or the like, a Ni plating layer of about several μm is provided on a Cu sputtered layer used as a substrate, and a plating layer of Sn or Sn-based alloy is further provided thereon. The Ni plating layer provided on the substrate is usually designated as an under barrier metal (UBM), and one purpose of providing the UBM is to inhibit generation of an intermetallic compound between Cu and Sn or Sn-based alloy due to metal diffusion.

Even when a UBM of a Ni plating layer is provided, however, a proportion of an intermetallic compound in a connecting portion between a Cu substrate or a Cu sputtered layer provided on a substrate and a Sn layer or a Sn-based alloy layer is increased due to recent miniaturization of an electronic circuit, which causes a problem of deterioration of electric characteristics and connection reliability. In order to solve this problem, studies have been made for reducing a generation amount of an intermetallic compound by providing, as a UBM, a Co plating layer or a Ni—Fe alloy plating layer below a Sn layer or a Sn alloy layer (see, for example, Patent Literature 1, Non Patent Literature 1 or the like).

CITATION LIST

Patent Literature

[Patent Literature 1] U.S. Pat. No. 9,082,762

NON PATENT LITERATURE

[Non Patent Literature 1] Ja-Kyung Koo and Jae-Ho Lee, Materials Transactions, Vol. 58 (2017), No. 2, p. 148-151

SUMMARY OF INVENTION

When a UBM disclosed in Patent Literature 1 or Non Patent Literature 1 is employed, a prescribed effect can be obtained, but it is difficult to sufficiently inhibit generation of an intermetallic compound in using a Co plating layer or a Ni—Fe alloy plating layer under more severe conditions, and there is a demand for a UBM having a new composition.

The present invention was devised in consideration of the above-described problem, and an object thereof is to obtain a UBM capable of further inhibiting generation of an intermetallic compound between a substrate containing a metal and a Sn layer or a Sn alloy layer.

In order to achieve the above-described object, the present inventors have found, as a result of earnest studies, that generation of an intermetallic compound can be remarkably inhibited in a structure including a Sn layer or a Sn alloy layer by using at least one of Fe, Co, Ru, Rh and Pd for forming a UBM, and thus, the present invention was accomplished.

Specifically, the structure including a Sn layer or a Sn alloy layer according to the present invention includes a substrate; a Sn layer or a Sn alloy layer formed above the substrate; and an under barrier metal formed between the substrate and the Sn layer or the Sn alloy layer in the form a single metal layer containing any one of or an alloy layer containing two or more of Fe, Co, Ru, Rh and Pd.

According to the structure including a Sn layer or a Sn alloy layer of the present invention, the under barrier metal in the form of a single metal layer of any one of Fe, Co, Ru, Rh and Pd or an alloy layer containing two or more of these is formed between the substrate and the Sn layer or the Sn alloy layer. Therefore, generation of an intermetallic compound through a reaction, caused due to metal diffusion of a metal contained in the substrate, between the metal and Sn contained in the Sn layer or the Sn alloy layer can be inhibited by the under barrier metal. Accordingly, the structure has good electric characteristics and connection reliability, and is suitably used in an electronic component or the like.

In the structure including a Sn layer or a Sn alloy layer of the present invention, the under barrier metal is preferably an alloy layer containing at least two of Fe, Co, Ru and Rh.

In this case, the under barrier metal more preferably contains a Fe—Co alloy, a Fe—Ru alloy or a Fe—Rh alloy.

Besides, in this case, the under barrier metal preferably contains Fe in a mass ratio of 10% or more.

In this manner, the ability of the under barrier metal to inhibit the generation of an intermetallic compound can be further improved.

According to a structure including a Sn layer or a Sn alloy layer of the present invention, generation of an intermetallic compound through a reaction, caused due to metal diffusion of a metal contained in a substrate, between the metal and Sn contained in the Sn layer or the Sn alloy layer can be inhibited. Accordingly, the structure has good electric characteristics and connection reliability, and is suitably used in an electronic component or the like.

BRIEF DESCRIPTION OF THE DRAWING

FIG. 1 is a diagram illustrating a structure including a Sn layer or a Sn alloy layer according to one embodiment of the present invention.

DETAILED DESCRIPTION OF EMBODIMENT

An embodiment for practicing the present invention will now be described with reference to the accompanying drawing. The description of a preferable embodiment given below is substantially illustrative and is not intended to limit the present invention, and an application method or use thereof.

A structure including a Sn layer or a Sn alloy layer according to one embodiment of the present invention will be described with reference to FIG. 1.

As illustrated in FIG. 1, in the structure of the present embodiment, an under barrier metal (UBM) 11 is formed on a substrate 10, and a Sn layer 12 is formed on the UBM 11. The substrate 10 is not especially limited, and can be, for example, a metal substrate of Cu, Ni or the like, a glass substrate, a silicon substrate or a sapphire substrate, an organic material substrate or the like. When it is not a metal substrate, however, a metal thin film of Cu or Ni or an alloy containing any of these is formed by plating or sputtering on the top surface thereof, and a structure in the shape of a projection containing Cu or Ni, or an alloy containing any of these is further formed thereon in some cases. Herein, the substrate including such a metal thin film and such a structure formed on the top surface thereof is inclusively designated as the substrate 10. Besides, the substrate 10 is not limited to a plate-shaped substrate, but may be a bar material in the shape of, for example, a bar or a line. The Sn layer 12 is made of a single metal of Sn, or a Sn alloy containing Sn. In particular, examples of the Sn alloy include, but are not limited to, Sn—Ag, Sn—Ag—Cu, Sn—Cu, Sn—Bi and Sn—In. The Sn layer 12 is formed by, for example, a ball mounting method, a pasting method, a plating method or an inkjet method, but the formation method is not limited to these.

When the Sn layer 12 is formed by an electroplating method, a Sn plating solution to be used basically contains a soluble stannous salt, an acid or a salt thereof used as a solution base, and if necessary, various additives such as an antioxidant, a stabilizer, a complexing agent, a surfactant, a brightener, a smoothing agent, a pH adjusting agent, a conductive salt and a preservative. Besides, as the soluble stannous salt, for example, any of stannous salts of organic sulfonic acids such as methanesulfonic acid, ethanesulfonic acid, 2-propanolsulfonic acid, sulfosuccinic acid and p-phenolsulfonic acid, stannous borofluoride, stannous sulfate, stannous oxide, stannous chloride, sodium stannate, potassium stannate and the like can be used. Besides, when the Sn layer 12 contains a Sn alloy, a Sn ally film may be formed by using a plating solution containing, for example, a Sn salt and another metal salt of Ag, Cu or the like, or an alloy film may be formed by laminating a Sn plating film and another metal film of Ag, Cu or the like, and melting the resultant by a heat treatment.

The antioxidant prevents oxidation of $Sn^{2+}$ in a bath, and can be, for example, hypophosphorous acid or a salt thereof, ascorbic acid or a salt thereof, hydroquinone, catechol, resorcin, fluoroglucin, cresol sulfonic acid or a salt thereof, phenol sulfonic acid or a salt thereof, catechol sulfonic acid or a salt thereof, hydroquinone sulfonic acid or a salt thereof, hydrazine or the like.

The stabilizer stabilizes a plating bath to prevent its decomposition, and can be, any of known stabilizers including a sulfur-containing compound such as a cyanide compound, a thiourea, thiosulfate, sulfite or acetylcysteine, and an oxycarboxylic acid such as citric acid.

The complexing agent is contained for stabilizing $Sn^{2+}$ in a neutral region to prevent generation of white precipitation or decomposition of the bath, and can be, for example, oxycarboxylic acid, polycarboxylic acid, monocarboxylic acid or the like, and specifically, gluconic acid, citric acid, glucoheptonic acid, gluconolactone, giucoheptolactone, formic acid, acetic acid, propionic acid, butyric acid, ascorbic acid, oxalic acid, malonic acid, citric acid, glycolic acid, malic acid, tartaric acid, diglycolic acid or a salt of any of these, or the like can be used. In particular, gluconic acid, citric acid, glucoheptonic acid, gluconolactone, glucoheptolactone or a salt of any of these is preferred. Besides, ethylenediamine, ethylenediaminetetraacetic acid (EDTA), diethylenetriaminepentaacetic acid (DTPA), nitrilotriacetic acid (NTA), iminodiacetic acid (IDA), iminodipropionic acid (IDP), hydroxyethylethylenediaminetriacetic acid (HEDTA), triethylenetetraminehexaacetic acid (TTHA), ethylene dioxybis(ethylamine)-N,N,N',N'-tetraacetic acid, a glycine, nitrotrimethylphosphonic acid, 1-hydroxyethane-1,1-diphosphonic acid, or a salt of any of these can be used.

The surfactant makes contribution to improvement of the appearance, the compactness, the smoothness, the adhesiveness and the like of a plating film, and any of usual nonionic, anionic, amphoteric or cationic surfactants can be used. As the anionic surfactant, alkyl sulfate, polyoxyethylene alkyl ether sulfate, polyoxyethylene alkyl phenyl ether sulfate, alkyl benzenesulfonate, alkyl naphthalenesulfonate or the like can be used. Examples of the cationic surfactant include mono-, di- and trialkyl amine salts, dimethyldialkyl ammonium salt and trimethylalkyl ammonium salt. As the nonionic surfactant, those obtained by addition condensation of 2 to 300 mol of ethylene oxide (EO) and/or propylene oxide (PO) with $C_1$ to $C_{20}$ alkanol, phenol, naphthol, a bisphenol, $C_1$ to $C_{25}$ alkylphenol, arylalkylphenol, $C_1$ to $C_{25}$ alkylnaphthol, $C_1$ to $C_{25}$ alkoxyl phosphoric acid (salt), sorbitan ester, polyalkylene glycol, $C_1$ to $C_{22}$ fatty amide or the like can be used. As the amphoteric surfactant, carboxybetaine, sulfobetaine, imidazolinebetaine, aminocarboxylic acid or the like can be used.

The brightener or a semi-brightener can be, for example, any of various aldehydes such as benzaldehyde, o-chlorobenzaldehyde, 2,4,6-trichlorobenzaldehyde, m-chlorobenzaldehyde, p-nitrobenzaldehyde, p-hydroxybenzaldehyde, furfural, 1-naphthaldehyde, 2-naphthaldehyde, 2-hydroxy-1-naphthaldehyde, 3-acenaphthaldehyde, benzylidene acetone, pyrididene acetone, furfurylidene acetone, cinnamaldehyde, anisaldehyde, salicylaldehyde, crotonaldehyde, acrolein, glutaraldehyde, paraldehyde and vanillin, triazine, imidazole, indole, quinoline, 2-vinylpyridine, aniline, phenanthroline, neocuproine, picolinic acid, thioureas, N-(3-hydroxybutylidene)-p-sulfanilic acid, N-butylidenesulfanilic acid, N-cinnamoylidenesulfanilic acid, 2,4-diamino-6-(2'-methylimidazolyl(1'))ethyl-1,3,5-triazine, 2,4-diamino-6-(2'-ethyl-4-methylimidazolyl(1'))ethyl-1,3,5-triazine, 2,4-diamino-6-(2'-undecylimidazolyl(1'))ethyl-1,3,5-triazine, phenyl salicylate, or any of benzothiazoles such as benzothiazole, 2-methylbenzothiazole, 2-mercaptobenzothiazole, 2-aminobenzothiazole, 2-amino-6-methoxybenzothiazole, 2-methyl-5-chlorobenzothiazole, 2-hydroxybenzothiazole, 2-amino-6-methylbenzothiazole, 2-chlorobenzothiazole, 2,5-dimethylbenzothiazole and 5-hydroxy-2-methylbenzothiazole.

Examples of the smoothing agent, some of which are the same as those described as the brightener above, include β-naphthol, β-naphthol-6-sulfonic acid, β-naphthalenesulfonic acid, m-chlorobenzaldehyde, p-nitrobenzaldehyde, p-hydroxybenzaldehyde, (o- or p-)methoxybenzaldehyde, vanillin, (2,4- or 2,6-)dichlorobenzaldehyde, (o- or p-)chlorobenzaldehyde, 1-naphthaldehyde, 2-naphthaldehyde, 2(4)-hydroxy-1-naphthaladehyde, 2(4)-chloro-1-naphthaldehyde, 2(3)-thiophene carboxaldehyde, 2(3)-furaldehyde, 3-indolecarboxaldehyde, salicylaldehyde, o-phthalaldehyde, formaldehyde, acetaldehyde, paraldehyde, butyraldehyde, isobutyraldehyde, propionaldehyde, n-valeraldehyde, acrolein, crotonaldehyde, glyoxal, aldol, succindialdehyde, capronaldehyde, isovaleraldehyde, allyl glutaraldehyde, 1-benzylidene-7-heptanal, 2,4-hexadienal, cinnamaldehyde, benzyl crotonaldehyde, an amine-aldehyde condensate, mesityl oxide, isophorone, diacetyl, hexandion-3,4, acetylacetone, 3-chlorobenzylideneacetone, sub. pyridylidene acetone, sub. furfurylidine acetone, sub. tenvlidene acetone, 4-(1-naphthyl)-3-buten-2-one, 4-(2-furyl)-3-buten-2-one, 4-(2-thiophenyl)-3-buten-2-one, curcumin, benzylidene acetylacetone, benzalacetone, acetophenone, (2,4- or 3,4-)dichloroacetophenone, benzylidene acetophenone, 2-cinnamylthiophene, 2-(ω-benzoyl)vinylfuran, vinyl phenyl ketone, acrylic acid, methacrylic acid, ethacrylic acid, ethyl acrylate, methyl methacrylate, butyl methacrylate, crotonic acid, propylene-1,3-dicarboxylic acid, cinnamic acid, (o-, m-, or p-)toluidine, (o- or p-)aminoaniline, aniline, (o- or p-)chloroaniline, (2,5- or 3,4-)chloromethyl aniline, N-monomethyl aniline, 4,4'-diaminodiphenylmethane, N-phenyl-(α- or β-)naphthylarnine, methylbenzotriazole, 1,2,3-triazine, 1,2,4-triazine, 1,3,5-triazine, 1,2,3-benzotriazine, imidazole, 2-vinylpyridine, indole, quinoline, a reaction product of monoethanolamine and o-vanillin, polyvinyl alcohol, catechol, hydroquinone, resorcin, polyethyleneimine, disodium ethylenediaminetetraacetate, and polyvinyl pyrrolidone. Besides, gelatin, polypeptone, N-(3-hydroxybutylidene)-p-sulfanilic acid, N-butylidenesulfanilic acid, N-cinnamoylidenesulfanilic acid, 2,4-diamino-6-(2'-methylimidazolyl(1'))ethyl-1,3,5-triazine, 2,4-diamino-6-(2'-ethyl-4-methylimidazolyl(1')) ethyl-1,3,5-triazine, 2,4-diamino-6-(2'-undecylimidazolyl (1'))ethyl-1,3,5-triazine, phenyl salicylate, and benzothiazoles are effectively used as the smoothing agent. Examples of the benzothiazoles include benzothiazole, 2-methylbenzothiazole, 2-mercaptobenzothiazole, (methylmercapto)benzothiazole, 2-aminobenzothiazole, 2-amino-6-methoxybenzothiazole, 2-methyl-5-chlorobenzothiazole, 2-hydroxybenzothiazole, 2-amino-6-methylbenzothiazole, 2-chlorobenzothiazole, 2,5-dimethylbenzothiazole, 6-nitro-2-mercaptobenzothiazole, 5-hydroxy-2-methylbenzothiazole and 2-benzothiazole thioacetic acid.

As the pH adjusting agent, any of various acids such as hydrochloric acid and sulfuric acid, and various bases such as ammonia water, potassium hydroxide and sodium hydroxide can be used, and besides, monocarboxylic acids such as formic acid, acetic acid and propionic acid, boric acids, phosphoric acids, dicarboxylic acids such as oxalic acid and citric acid, and oxycarboxylic acids such as butyric acid and tartaric acid can be used.

As the conductive salt, any of sodium salts, potassium salts, magnesium salts, ammonium salts, amine salts and the like of sulfuric acid, hydrochloric acid, phosphoric acid, sulfamic acid, sulfonic acid and the like can be used, and it is noted that the above-described pH adjusting agent can be used also as the conductive salt in some cases.

As the preservative, boric acid, 5-chloro-2-methyl-4-isothiazolin-3-one, benzalkonium chloride, phenol, phenol polyethoxylate, thymol, resorcin, isopropylamine, guaiacol and the like can be used.

The UBM 11 is provided for inhibiting formation of an intermetallic compound 13 otherwise formed through a reaction, caused due to metal diffusion of a metal contained in the substrate 10, between the metal and Sn contained in the Sn layer 12. The UBM 11 is a single metal layer containing any one of Fe, Co, Ru, Rh and Pd, or an alloy layer containing two or more of these. The UBM 11 is preferably an alloy layer containing at least two of Fe, Co, Ru and Rh, and more preferably contains a Fe—Co alloy, a Fe—Ru alloy or a Fe—Rh alloy. In this case. Fe is preferably contained in a mass ratio of 10% or more. Owing to such a constitution, an effect of inhibiting the generation of the intermetallic compound 13 by the UBM 11 can be improved.

The UBM 11 can be formed by a method of, for example, plating, sputtering, deposition, ball mounting, paste printing or the like. For example, when the UBM 11 is formed by electroplating, a solution containing at least one of water-soluble Co salt, Rh salt, Fe salt, Rh salt and Pd salt dissolved therein, and appropriately containing an acid or a salt thereof as a solution base, and if necessary, any of the above-described various additives such as the antioxidant, the stabilizer, the complexing agent, the surfactant, the brightener, the smoothing agent, the pH adjusting agent, the conductive salt and the preservative can be used as a plating solution.

In the structure of the present embodiment employing the UBM 11 having the above-described composition, although the intermetallic compound 13 is generated as illustrated in FIG. 1, the thickness can be extremely reduced as compared with that in a conventional structure.

The structure of the present embodiment is applicable to electronic components such as a printed wiring board, a semiconductor integrated circuit, a resistor, a capacitor, a filter, a thermistor, a crystal oscillator, a switch, a lead wire and a solar cell, but the application is not limited to these.

EXAMPLES

Examples will now be described for describing, in detail, the structure including a Sn layer or a Sn alloy layer according to the present invention.

In these examples, a thickness of an intermetallic compound generated in each of a structure including the above-described UBM and including a Sn layer or a Sn alloy layer (Examples 1 to 7) and a structure including a conventional UBM different from the above-described UBM and including a Sn layer or a Sn alloy layer (Comparative Examples 1 to 3) was measured for comparison.

Specifically, in each of Examples 1 to 7 and Comparative Examples 1 to 3, a substrate was obtained by forming a copper plating layer on a top surface of a semiconductor wafer, and on the substrate, a UBM, and a Sn layer or a Sn alloy layer were successively formed by the electroplating. The electroplating was performed by a usual known method, and a plating solution in which any one or more of a water-soluble Ni salt, Co salt, Rh salt, Fe salt, Rh salt, Pd salt, Sn salt, Ag salt and Cu salt were dissolved in accordance with the type of a plating film to be formed, and any of various additives were contained was used. Besides, plating conditions of 50° C. and 2 A/dm$^2$ were employed, and a thickness of each plating film was set to 3 μm. Compositions of the UBM and the Sn layer or the Sn alloy layer formed in each of the examples and comparative examples are shown in Table 1 below. It is noted that a numerical value shown in each column of the UBM in Table 1 indicates a mass ratio, and for example, "Ni30Fe70" indicates an alloy containing 30% by mass of Ni and 70% by mass of Fe.

Each of the structures of Examples 1 to 7 and Comparative Examples 1 to 3 was subjected to a heat treatment at 180° C. for 150 hours, and a thickness of an intermetallic compound generated under the Sn layer or the Sn alloy layer was measured thereafter, and the result is shown in Table 1. It is noted that the thickness of the intermetallic compound is shown as a ratio calculated with the result of Comparative Example 1 used as a reference (100%).

TABLE 1

| | UBM | Sn Layer or Sn Alloy Layer | Thickness (%) of Intermetallic Compound after Heat Treatment at 180° C. for 150 hrs |
|---|---|---|---|
| Comparative Example 1 | Ni | Sn—Ag | 100% |
| Comparative Example 2 | Ni30Fe70 | Sn—Ag | 189.1% |
| Comparative Example 3 | Ni42Fe58 | Sn | 126.8% |
| Example 1 | Ru | Sn | 91.3% |
| Example 2 | Rh | Sn—Ag—Cu | 88.1% |
| Example 3 | Co30Fe70 | Sn—Ag | 23.1% |
| Example 4 | Co90Fe10 | Sn | 86.6% |
| Example 5 | Rh30Fe70 | Sn | 54.4% |
| Example 6 | Ru30Fe70 | Sn | 72.6% |
| Example 7 | Fe | Sn—Bi | 52.3% |

As shown in Table 1, as compared with the case where a Ni layer was used as the UBM as in a conventional UBM and a Sn—Ag alloy layer was formed thereon (Comparative Example 1), when a Ni—Fe alloy layer was used as the UBM, the thickness of the generated intermetallic compound was larger than in Comparative Example 1 even if a Sn—Ag layer (Comparative Example 2) or a Sn layer (Comparative Example 3) was formed thereon. On the other hand, when a single metal layer of any one of Fe, Co, Ru, Rh and Pd, or an alloy layer containing two or more of these was used as the UBM (Examples 1 to 7), the thickness of the generated intermetallic compound was smaller than in Comparative Example 1. In other words, it was revealed that when such a single metal layer or an alloy layer is used as the UBM, the generation of an intermetallic compound can be inhibited as compared with that in the conventional structure.

As described so far, according to the structure including a Sn layer or a Sn alloy layer of the present invention, the generation of an intermetallic compound through a reaction, caused due to metal diffusion of a metal contained in a substrate, between the metal and Sn contained in the Sn layer or the Sn alloy layer can be inhibited. Accordingly, the structure has good electric characteristics and connection reliability, and is suitably used in an electronic component or the like.

DESCRIPTION OF REFERENCE CHARACTERS

10 Substrate
11 Under barrier metal (UBM)
12 Sn layer (or Sn alloy layer)
13 Intermetallic compound

What is claimed is:
1. A structure including a Sn layer or a Sn alloy layer, comprising:
  a substrate;
  the Sn layer or the Sn alloy layer formed above the substrate; and
  an under barrier metal formed between the substrate and the Sn layer or the Sn alloy layer,
  wherein the under barrier metal consist of a Fe—Co alloy,
  wherein the under barrier metal contains Fe in a mass ratio of 70% or more.

* * * * *